United States Patent
Nagai et al.

(10) Patent No.: US 7,464,320 B2
(45) Date of Patent: Dec. 9, 2008

(54) SYNCHRONOUS SEMICONDUCTOR STORAGE DEVICE HAVING ERROR CORRECTION FUNCTION

(75) Inventors: Takeshi Nagai, Yokohama (JP); Shinji Miyano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 574 days.

(21) Appl. No.: 11/274,402

(22) Filed: Nov. 16, 2005

(65) Prior Publication Data

US 2006/0200728 A1    Sep. 7, 2006

(30) Foreign Application Priority Data

Mar. 4, 2005  (JP)  ............................. 2005-060424

(51) Int. Cl.
*G11C 29/00* (2006.01)
(52) U.S. Cl. ...................................... 714/763
(58) Field of Classification Search ................. 714/763, 714/746, 769
See application file for complete search history.

(56) References Cited

U.S. PATENT DOCUMENTS 5,852,586 A * 12/1998 Fujita .......................... 365/193
6,310,815 B1 * 10/2001 Yamagata et al. ......... 365/230.03
6,314,042 B1 * 11/2001 Tomishima et al. ...... 365/230.03
7,266,759 B2 * 9/2007 Koga et al. ................... 714/805

OTHER PUBLICATIONS

Yasuhiro Takai, et al., "250 Mbyte/s Synchronous DRAM Using a 3-Stage-Pipelined Architecture", IEEE Journal of Solid-State Circuits, vol. 29, No. 4, Apr. 1994, pp. 426-431.

* cited by examiner

*Primary Examiner*—Shelly A Chase
(74) *Attorney, Agent, or Firm*—Oblon, Spivak, McClelland, Maier & Neustadt, P.C.

(57) ABSTRACT

A semiconductor memory device has a memory cell array in which a plurality of memory cells are arranged and operates in sync with a clock signal. A read and write operations are performed in the same cycle of the clock signal. The read operation allows the read column selection lines that have been designated by a first column address to connect the read data bus to the bit lines. The write operation allows the write column selection lines that have been designated by a second column address to connect the write data bus to the bit lines. Further, in the write operation, the data obtained by combining the data that has been error-corrected by the syndrome generation circuit and correction circuit with the data that has been input to the input circuit is coded by the code generation circuit and written in the memory cells.

10 Claims, 17 Drawing Sheets

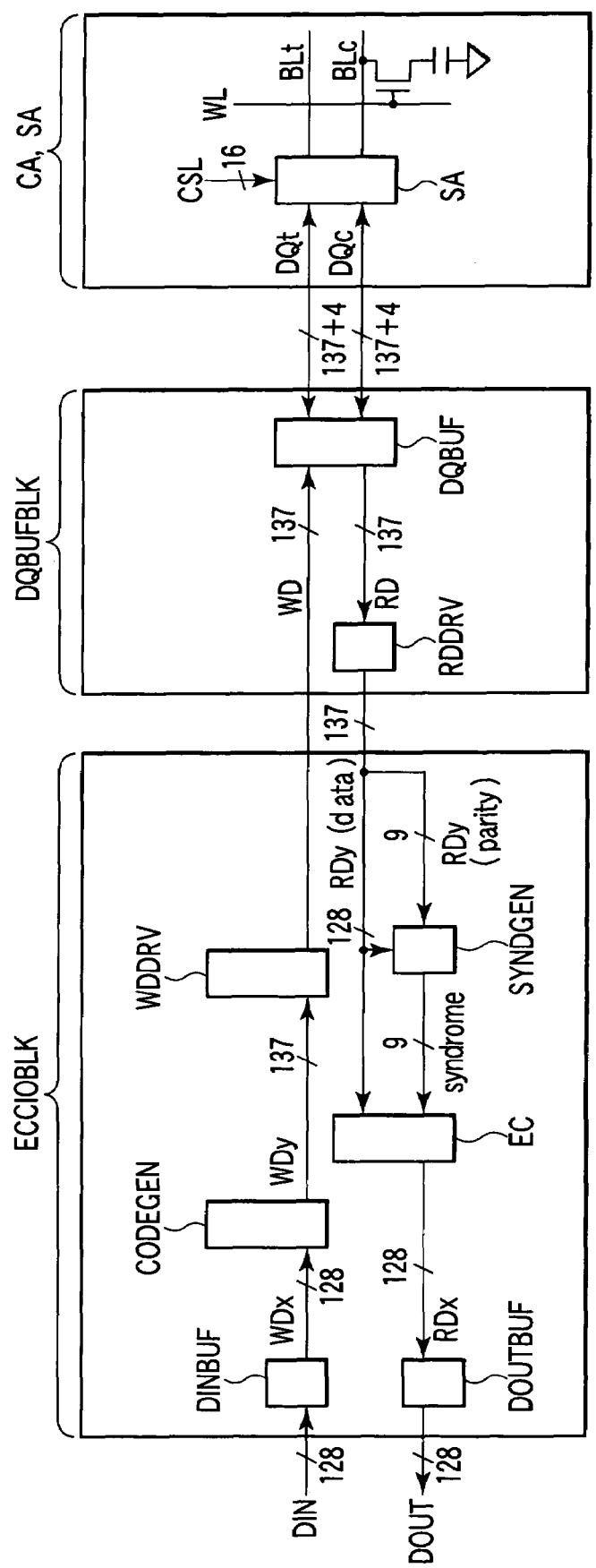
F I G. 1

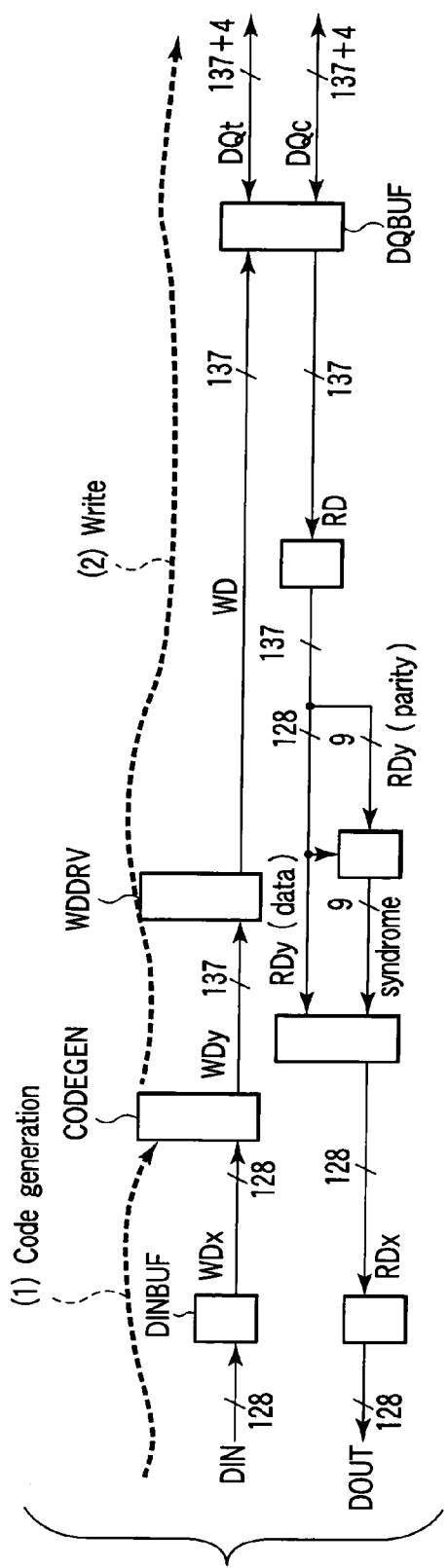
F I G. 2
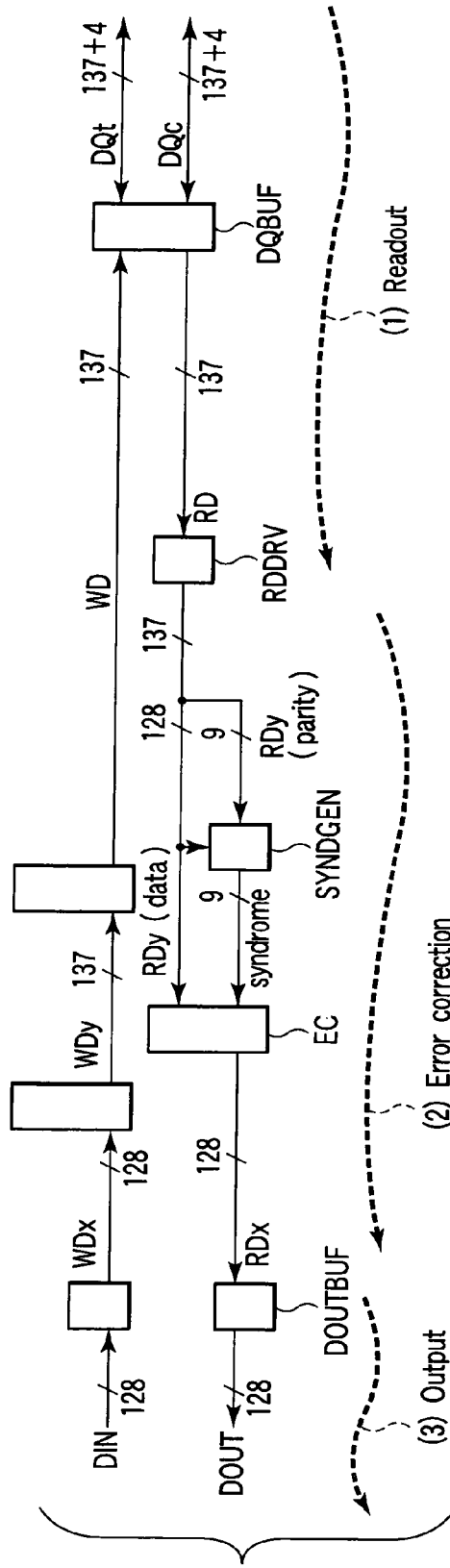
F I G. 3

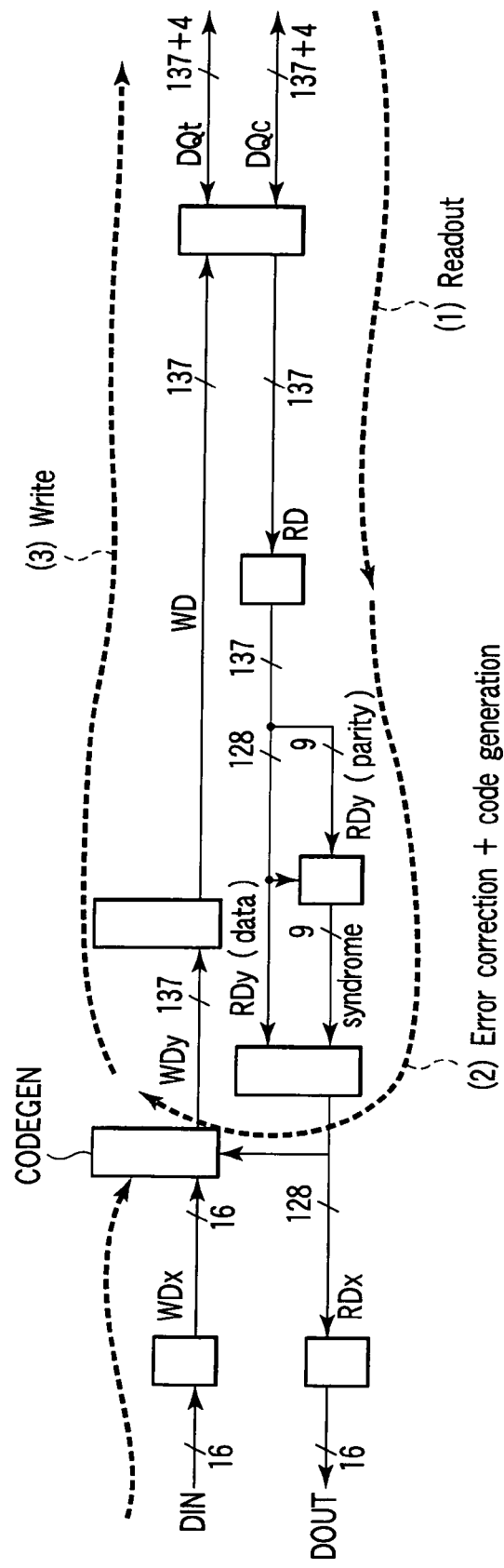
F I G. 5

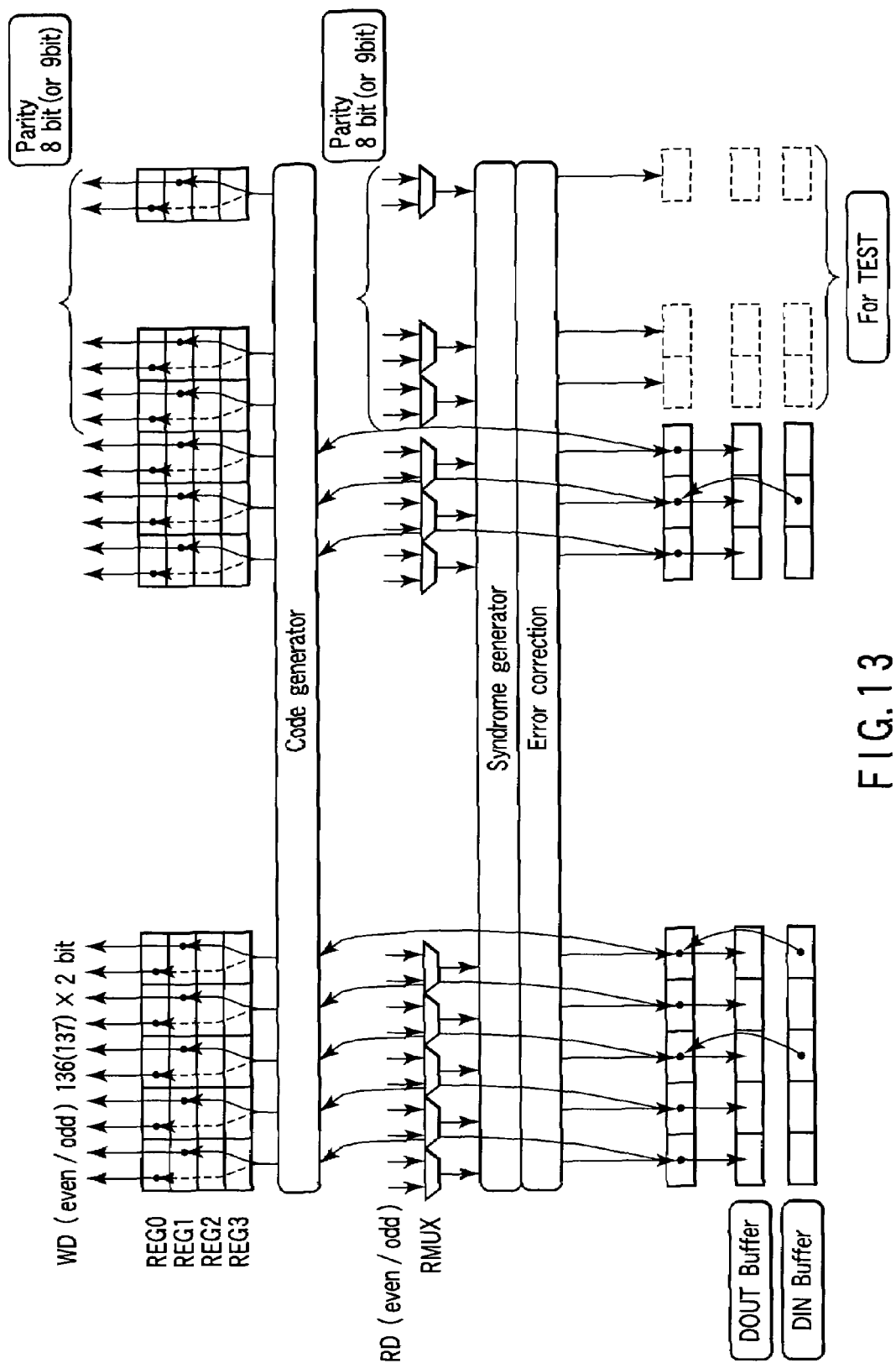
F I G. 13

[ 2 burst ]

| Start address (Column address A0 binary number) | Order in sequential addressing (decimal number) | Order in interleave addressing (decimal number) |
|---|---|---|
| 0 | 0.1 | 0.1 |
| 1 | 1.0 | 1.0 |

[ 4 burst ]

| Start address (Column address A1-A0 binary number) | Order in sequential addressing (decimal number) | Order in interleave addressing (decimal number) |
|---|---|---|
| 00 | 0.1.2.3 | 0.1.2.3 |
| 01 | 1.2.3.0 | 1.0.3.2 |
| 10 | 2.3.0.1 | 2.3.0.1 |
| 11 | 3.0.1.2 | 3.2.1.0 |

[ 8 burst ]

| Start address (Column address A2-A0 binary number) | Order in sequential addressing (decimal number) | Order in interleave addressing (decimal number) |
|---|---|---|
| 000 | 0.1.2.3.4.5.6.7 | 0.1.2.3.4.5.6.7 |
| 001 | 1.2.3.4.5.6.7.0 | 1.0.3.2.5.4.7.6 |
| 010 | 2.3.4.5.6.7.0.1. | 2.3.0.1.6.7.4.5 |
| 011 | 3.4.5.6.7.0.1.2 | 3.2.1.0.7.6.5.4 |
| 100 | 4.5.6.7.0.1.2.3 | 4.5.6.7.0.1.2.3 |
| 101 | 5.6.7.0.1.2.3.4 | 5.4.7.6.1.0.3.2 |
| 110 | 6.7.0.1.2.3.4.5 | 6.7.4.5.2.3.0.1 |
| 111 | 7.0.1.2.3.4.5.6 | 7.6.5.4.3.2.1.0 |

FIG.16

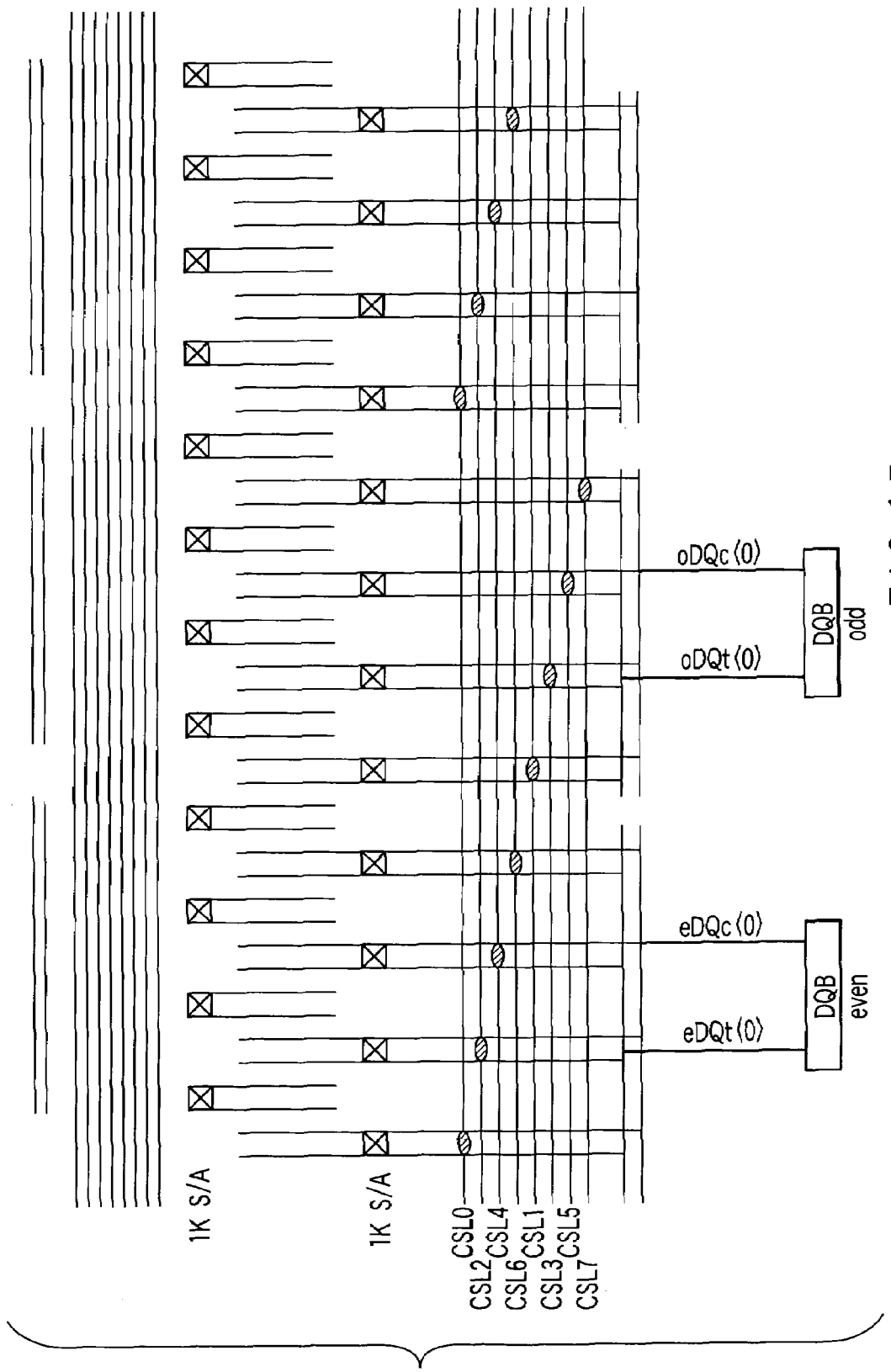

SYNCHRONOUS SEMICONDUCTOR STORAGE DEVICE HAVING ERROR CORRECTION FUNCTION

CROSS-REFERENCE TO RELATED APPLICATIONS

This application is based upon and claims the benefit of priority from prior Japanese Patent Application No. 2005-060424, filed Mar. 4, 2005, the entire contents of which are incorporated herein by reference.

BACKGROUND OF THE INVENTION

1. Field of the Invention

The present invention relates to a synchronous semiconductor memory device having an error correction function.

2. Description of the Related Art

A synchronous semiconductor memory device synchronized with a clock has been used for high-speed data transfer. For example, a synchronous DRAM using a 3-stage-pipelined architecture has been disclosed as a synchronous semiconductor memory device (e.g., see Y. Takai et al, "250 Mbyte/s Synchronous DRAM Using a 3-Stage-Pipelined Architecture", IEEE J. Solid-State Circuits, Vol. 29, No. 4, Apr. 1994).

Here, assume that an error correction function is applied to the synchronous semiconductor memory device as described above. FIG. 1 is a view showing only the configuration along data buses in a DRAM macro that the semiconductor memory device includes, to which an ECC (error checking and correction) has been applied.

A cell array CA and sense amplifier SA, a control circuit DQBUFBLK, and an ECC input/output block ECCIOBLK are arranged from the right in FIG. 1. 16 column selection lines CSL are input to the sense amplifier SA. A DQ buffer DQBUF and RD line drive circuit RDDRV are arranged on the control circuit DQBUFBLK. The DQ buffer DQBUF includes a DQ line read buffer and DQ line write buffer which perform a column redundancy control and DQ line control. The RD line drive circuit RDDRV drives an RD line.

Arranged on the ECC input/output block ECCIOBLK are circuit blocks including an input buffer DINBUF and output buffer DOUTBUF which perform data input/output controls, a code generation circuit CODEGEN for realizing an ECC function, a syndrome generator SYNDGEN, and an error correction circuit EC, and a WD line drive circuit WDDRV for driving a WD line. The code generation circuit CODEGEN generates a code at the data write time. The syndrome generator SYNDGEN generates a syndrome at the data read time. The error correction circuit EC decodes the syndrome and performs an error correction.

FIG. 2 is a view for explaining the data flow at the write operation time in FIG. 1. The external data bus width is set to 128 bits and input data DIN is transmitted, as 128-bit data WDx, through the input buffer DINBUF. The code generation circuit CODEGEN uses the 128-bit data WDx as information bit to generate an error correction code. A systematic hamming code that can correct a single-bit error and detect a double-bit error is used as the error correction code. At this time, it is sufficient for a check code to have a 9-bit length, so that the code length of the error correction code becomes 137 bits, which is obtained by adding 128 bits as information bit and 9 bits as parity bit. The coded 137-bit data WDy is driven in the WD line drive circuit WDDRV, transmitted to the DQ buffer DQBUF, and written in memory cells through the DQ line. The DQ line is a complementary signal line pair of DQt/DQc and includes four DQ line pairs for column redundancy.

FIG. 3 is a view for explaining the data flow at the read operation time in FIG. 1. The data including a column redundancy and parity bit for ECC is read out from the cell array, passed through a 141-bit DQ line, and input to the DQ buffer DQBUF. The data that has been input to the DQ buffer DQBUF is subjected to a redundancy control and transmitted to a 137-bit RD line. The data read out to the RD line is driven in the RD line drive circuit RDDRV to become data RDy and reaches the syndrome generator SYNDGEN in the ECC input/output block ECCIOBLK and error correction circuit EC.

Of the 137-bit data RDy, 9 bits as parity bit and 128 bits as information bit are input to the syndrome generator SYNDGEN. The syndrome generator SYNDGEN then generates a 9-bit syndrome. The generated syndrome is decoded in the error correction circuit EC. When any errors exist in the 128-bit information bit RDy, the error correction circuit EC corrects the error, if possible. The error-corrected information bit RDx is output to the outside as data DOUT through the data output buffer DOUTBUF.

At this time, the external data bus width has been set to 128 bits and information length used when a data coding process and data error correction are performed in the DRAM macro has also set to 128 bits. In this case, there is no big problem as to a pipeline operation, as described below.

FIGS. 4A and 4B are views each showing a pipeline operation at that time in a schematic manner. FIG. 4A shows a read operation and FIG. 4B shows a write operation.

In FIG. 4A, when column address CA0 is sequentially input in response to the input of read command <R>, read operation (R0) including an address decode, selection of the column selection lines CSL, and data read out to the RD line is performed in Cycle 0. In Cycle 1, read operation (R1) for column address CA1 is performed in the same manner as read operation (R0). At the same time, error correction operation (E0) is performed for the data read out by read operation (R0) for column address CA0. In Cycle 2, read operation (R2) for column address CA2, error correction operation (E1) for column address CA1 and output operation (Q0) for column address CA0 are performed in parallel.

In FIG. 4B, write command <W> and write data <D0> for column address CA0 are input and code generation operation (E0) is performed in Cycle 0. Subsequently, in Cycle 1, after write command <W> and write data <D1> for column address CA1 have been input, code generation operation (E1) and write operation (W0) for column address CA0 are performed. The operations in the subsequent cycles are performed in the same manner as described above.

However, in the above pipeline operations, when the external data bus width is smaller than the information length used at the error correction time, or the bit width of the data to be input becomes substantially smaller than the information length due to an application of a byte mask function, the following problem occurs.

In a semiconductor memory device having an error correction function, information bit is coded and stored in a plurality of memory cells at the write operation time; and when the data that has been read out from memory cells includes any errors, the data is subjected to an error correction and output to the outside at the read operation time. In general, the larger the information length, the smaller the percentage of the parity bit needed for an error correction becomes. This is effective when using an error correction code.

However, in a semiconductor memory device having a configuration in which there is a possibility that, when the external input bus width is smaller than the internal bus width or due to an application of a byte mask function, the length of the data to be written in memory cells becomes substantially smaller than information length (although the external input bus width is not necessarily smaller than the internal bus width), an operation called "Read-Modify-Write in ECC" is required. Therefore, speed penalty becomes noticeable to significantly degrade the performance. In the "Read-Modify-Write in ECC", assuming that the internal bus width is substantially equal to the code length of an error correction code, data is once read out from memory cells by its code length and an error correction operation is applied to the data at the write operation time. After that, the data that has been read out and corrected is overwritten with externally input write data having a length smaller than the information length. Finally, the data is coded and written in memory cells.

FIG. 5 shows the data flow at the write operation time in this case. The information length of an error correction code is set to 128 bits and the code length thereof is set to 137 bits. An external input has a 16-bit bus width. The bus width inside a DRAM macro is, when including parity bit, 137 bits, which is substantially the same as the code length. The data to be input is only 16 bits, so that it is impossible to use 128-bit code, if nothing is done.

In this case, therefore, the following operation needs to be performed.

(1) Data is read out from memory cells at the corresponding address by 137 bits.

(2) An error correction is performed to obtain correct 128-bit information bit, and the correct 128-bit information bit is overwritten with the input 16-bit write data to be written. A code is generated for the overwritten new information bit to obtain data WDy with 137-bit code data to be written in memory cells.

(3) The code data WDy is written in memory cells.

FIGS. 6A, 6B, and 6C are views each showing an operation in the case where the bit width of the input data is smaller than the information length. The read operation shown in FIG. 6A is entirely the same as that shown in FIG. 4A.

The write (Read-Modify-Write) operation shown in FIG. 6B is performed as follows. When write command W is sequentially input as in the case of FIG. 4B, read operation (R0) is performed in Cycle 0, error correction and coding (E0) are performed in Cycle 1, and write operation (W0) is performed in Cycle 2. In read operation (R0), column selection lines CSL corresponding to address CA0 are selected and data is read out from memory cells. In write operation (W0), column selection lines CSL corresponding to address CA0 are selected and coded data is written in memory cells.

At this time, when write command W corresponding to address CA2 is input in Cycle 2, read operation (R2) is performed in Cycle 2. Therefore, read operation (R2) and write operation (W0) are performed simultaneously in Cycle 2. That is, column selection lines CSL corresponding to different addresses are activated at the same cycle in the sense amplifier SA shown in FIG. 1, which may bring about data collision. In order to prevent the data collision, the cycle time must be extended. For example, as in the case of the write operation shown in FIG. 6C, when read operation (R0), error correction coding (E0), and write operation (W0) are performed in one cycle, the data collision does not occur. In this case, however, the cycle time is obviously increased to make it impossible to perform high-speed data transfer.

BRIEF SUMMARY OF THE INVENTION

According to an first aspect of the present invention, there is provided a semiconductor memory device which operates in synchronization with a clock signal comprising: a memory cell array in which a plurality of memory cells are arranged; a plurality of bit lines connected to the plurality of memory cells; an input circuit to which data is input; a code generation circuit which codes data and generates an error correction code; a read data bus to which the data that has been read out from the memory cells is supplied; a write data bus to which the data that has been coded by the code generation circuit is supplied; a plurality of read column selection lines which are designated by a column address and connects the read data bus to the bit lines; a plurality of write column selection lines which are designated by a column address and connects the write data bus to the bit lines; a syndrome generation circuit which generates a syndrome from the data that has been read out from the memory cells to the read data bus; and a correction circuit which decodes the syndrome that has been generated by the syndrome generation circuit and performs an error correction. A read and write operations are performed in the same cycle of the clock signal. The read operation allows the read column selection lines that have been designated by a first column address to connect the read data bus to the bit lines. The write operation allows the write column selection lines that have been designated by a second column address to connect the write data bus to the bit lines. In the write operation, the data obtained by combining the data that has been error-corrected by the syndrome generation circuit and correction circuit with the data that has been input to the input circuit is coded by the code generation circuit and written in the memory cells.

According to a second aspect of the present invention, there is provided a semiconductor memory device which has a burst mode and operates in synchronization with a clock signal comprising: a memory cell array in which a plurality of memory cells are arranged; a plurality of bit lines connected to the plurality of memory cells; an input circuit to which data is input; a code generation circuit which codes data and generates an error correction code; a plurality of storage circuits which is arranged at the a stage subsequent to the code generation circuit and stores the error correction code that has been output from the code generation circuit; a first data bus which is connected to the bit lines by column selection lines when even column address has been designated and has a bits width greater than or equal to that of the data that has been coded by the code generation circuit; a second data bus which is connected to the bit lines by column selection lines when odd column address has been designated and has a bits width greater than or equal to that of the data that has been coded by the code generation circuit; a syndrome generation circuit which generates a syndrome from the data that has been read out to the first and second data buses from memory cells; and a correction circuit which decodes the syndrome that has been generated by the syndrome generation circuit and performs an error correction. At the read operation time in the burst mode, the data corresponding to odd and even addresses which are generated by the burst are read out from memory cells in the same cycle of the clock signal, subjected to an error correction by the syndrome generation circuit and correction circuit, and output to the outside. At the write operation time in the burst mode, the data corresponding to odd and even addresses which are generated by the burst are read out from memory cells in the same cycle of the clock signal and subjected to an error correction by the syndrome generation circuit and correction circuit, and the data obtained by combining the data that has been error-corrected with the data that has been input to the input circuit is coded and sequentially written in the storage circuits. The data is fetched from the storage circuits that store the data corresponding to the even and odd addresses and written in memory cells in the same cycle of the clock signal through the first and second data buses.

According to a third aspect of the present invention, there is provided a semiconductor memory device which has a burst mode and performs a pipeline operation in synchronization with a clock signal comprising: a memory cell array in which a plurality of memory cells are arranged; a plurality of bit lines connected to the plurality of memory cells; an input circuit to which data is input; a code generation circuit which codes data and generates an error correction code; a plurality of storage circuits which is arranged at a stage subsequent to the code generation circuit and stores the error correction code that has been output from the code generation circuit; a first data bus which is connected to the bit lines by column selection lines when even column address has been designated and has a bits width greater than or equal to that of the data that has been coded by the code generation circuit; a second data bus which is connected to the bit lines by column selection lines when odd column address has been designated and has a bits width greater than or equal to that of the data that has been coded by the code generation circuit; a syndrome generation circuit which generates a syndrome from the data that has been read out to the first and second data buses from memory cells; and a correction circuit which decodes the syndrome that has been generated by the syndrome generation circuit and performs an error correction. The pipeline operation is performed as follows: at the read operation time in the burst mode, data in the memory cells is read out to the first or second data bus depending on whether the current cycle is even-numbered cycle or odd-numbered cycle counting from the clock signal cycle at which the read command for performing the read operation has been input, and the read out data is then error-corrected by the syndrome generation circuit and correction circuit so as to be output to the outside; at the write operation time in the burst mode, data in the memory cells is read out to the first or second data bus depending on whether the current cycle is even-numbered cycle or odd-numbered cycle counting from the clock signal cycle at which the write command for performing the write operation has been input, the read out data is then error-corrected by the syndrome generation circuit and correction circuit, and the data obtained by combining the error-corrected data with the data that has been input to the input circuit is coded and sequentially written in the storage circuits so as to be written in the memory cells. In the above pipeline operation, a writing operation to the memory cells with respect to odd address is performed when a reading operation from the memory cells with respect to even address is performed, and a writing operation to the memory cells with respect to even address is performed when a reading operation from the memory cells with respect to odd address is performed in the same cycle of the clock signal.

BRIEF DESCRIPTION OF THE SEVERAL VIEWS OF THE DRAWING

FIG. 1 is a view showing the configuration along data buses in a conventional DRAM macro to which an ECC (error checking and correction) has been applied;

FIG. 2 is a view showing the data flow at the write operation time in the conventional DRAM macro;

FIG. 3 is a view showing the data flow at the read operation time in the conventional DRAM macro;

FIG. 5 is a view showing the data flow at the write operation time in the case where the external input bus width is smaller than the information length of an error correction code in the conventional DRAM macro;

FIG. 13 is a view showing the configuration of an ECC input/output block in the semiconductor memory device according to the second embodiment;

FIG. 16 shows addressing modes of a normal synchronous DRAM;

FIG. 17 is a view showing the configuration of the sense amplifier in the semiconductor memory device according to the second embodiment.

DETAILED DESCRIPTION OF THE INVENTION

Figure 4A:
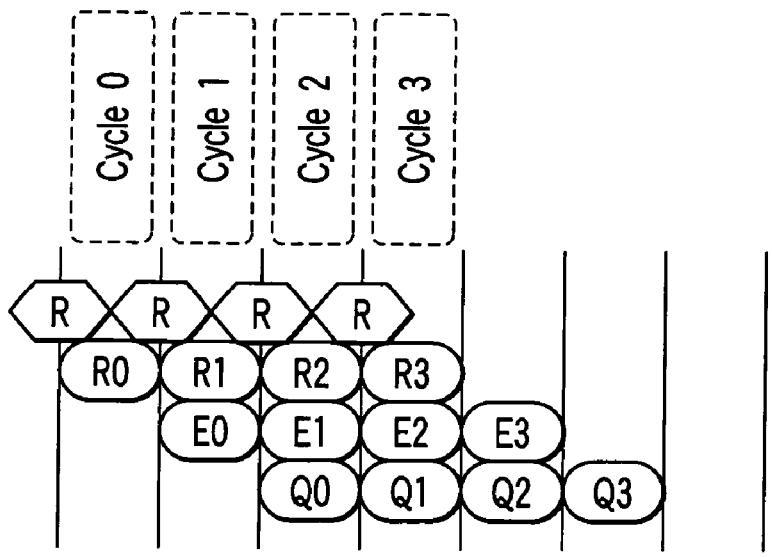
FIGS. 4A and 4B are views each showing a pipeline operation in the conventional DRAM macro.
Figure 4B:
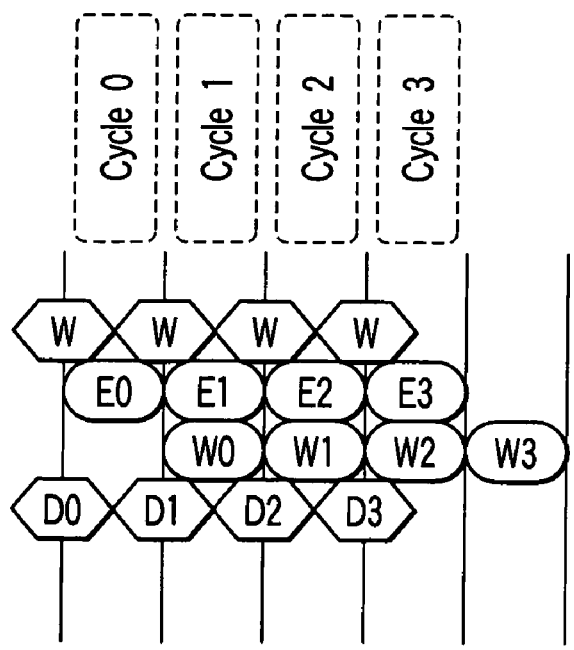
Figure 6A:
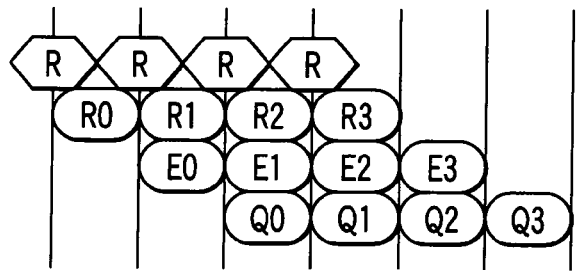
FIGS. 6A, 6B and 6C are views each showing an operation in the case where the external input bus width is smaller than the information length of an error correction code in the conventional DRAM macro.
Figure 6B:
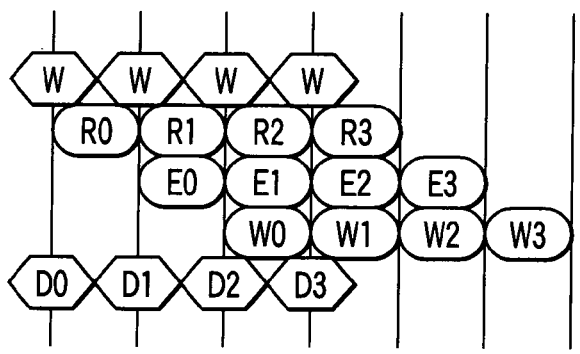
Figure 6C:
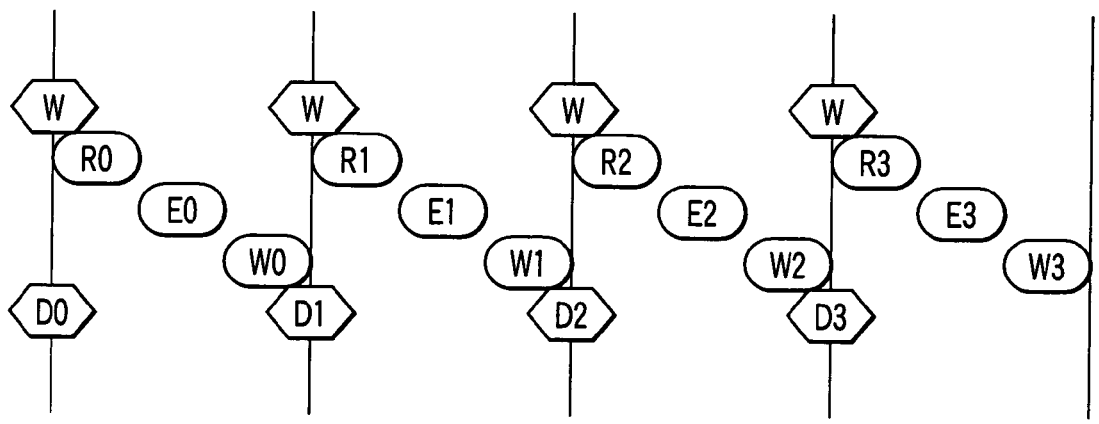

Embodiments of the present invention will be described below with reference to the accompanying drawings. In the following description, the same reference numerals denote the same parts through the drawing.

First Embodiment

A semiconductor memory device according to a first embodiment of the present invention will be described.

Figure 7:
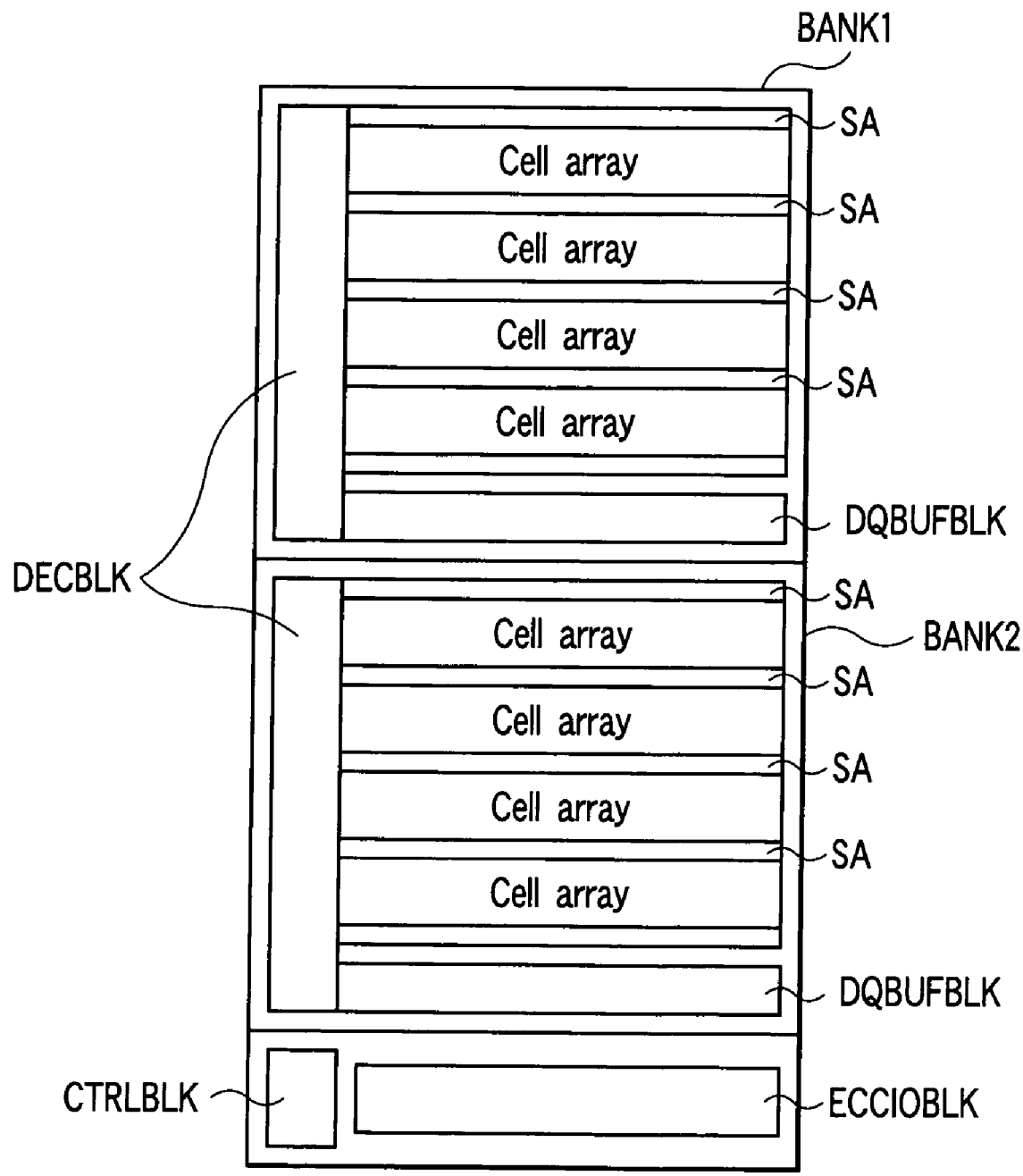
FIG. 7 is an arrangement diagram showing the configuration of a clock synchronous type DRAM macro mounted on a semiconductor memory device according to a first embodiment of the present invention.

FIG. 7 is an arrangement diagram showing the configuration of a semiconductor memory device according to the first embodiment of the present invention that includes a clock synchronous type DRAM macro. This DRAM macro may individually be formed on a semiconductor substrate, or may be mounted on a semiconductor substrate together with a logic circuit.

In this example, the DRAM macro includes two sub-macros (bank BANK 1 and 2) and a control block CTRLBLK and ECC input/output block ECCIOBLK which are disposed under the DRAM macro. The control block CTRLBLK performs a timing control of operations such as command input and address input buffer based on the clock. The ECC input/output block ECCIOBLK performs an ECC (error checking and correction) control and data input/output operation.

The two sub-macros constitutes a bank BANK1 and bank BANK2, respectively. A decoder block DECBLK includes a row address decoder, a column address decoder, a sense amplifier control circuit, and the like. Each bank has four 1 Mbit cell arrays each constituted by 512 word lines, 2048 bit line pairs, several spare bit line pairs, and memory cells located at the point of intersection between respective word lines and bit line pairs.

Sense amplifiers SA for amplifying the signal that has been read out from memory cells to the bit lines are disposed on both sides of each cell array. A control circuit DQBUFBLK is disposed under each sub-macro. The control circuit DQBUFBLK writes the write data transmitted from the ECC input/output block ECCIOBLK in memory cells and transmits the data that has been read out from memory cells to the ECC input/output block ECCIOBLK. The ECC input/output block ECCIOBLK codes the write data that has been input from the outside and transmits the coded data to the control circuit DQBUFBLK. When the read data that has been transmitted from the control circuit DQBUFBLK includes any errors, the ECC input/output block ECCIOBLK corrects the errors and outputs the corrected data to the outside of the chip.

Figure 8:
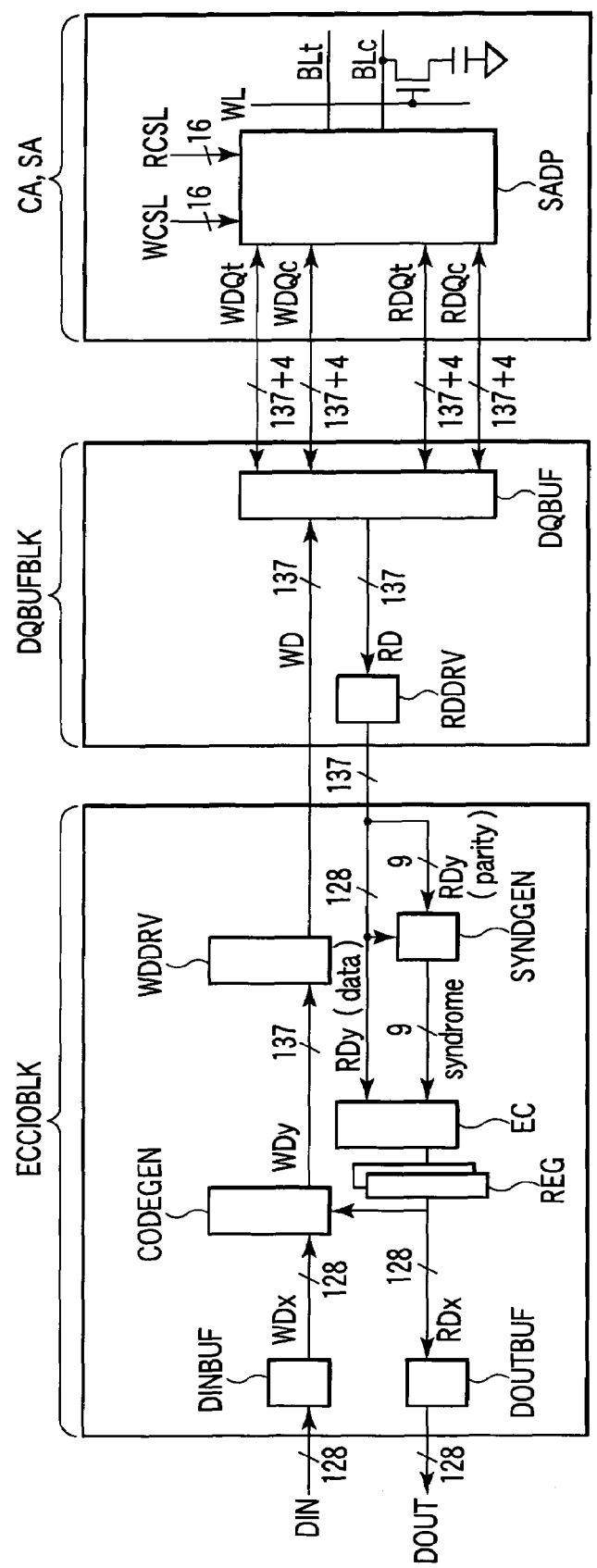
FIG. 8 is a view showing the configuration along data buses in the semiconductor memory device according to the first embodiment.

FIG. 8 is a view showing the configuration along data buses in the semiconductor memory device according to the first embodiment. As shown in FIG. 8, a cell array CA and sense amplifier SA, a control circuit DQBUFBLK, and an ECC input/output block ECCIOBLK are arranged starting from the cell array side. The cell array CA has a plurality of memory cells arranged in a matrix. 16 column selection lines WCSL and 16 column selection lines RCSL are input to the sense amplifier SA. A DQ buffer DQBUF and RD line drive circuit RDDRV are arranged on the control circuit DQBUFBLK. The DQ buffer DQBUF includes a DQ line read buffer and DQ line write buffer which perform a column redundancy control and DQ line control. The RD line drive circuit RDDRV drives an RD line.

Arranged on the ECC input/output block ECCIOBLK are circuit blocks including an input buffer DINBUF and output buffer DOUTBUF which perform data input/output controls, a code generation circuit CODEGEN for realizing an ECC function, a syndrome generator SYNDGEN, an error correction circuit EC, and a register REG, and a WD line drive circuit WDDRV for driving a WD line. The code generation circuit CODEGEN generates a code (i.e. an error correction code) at the data write time. The syndrome generator SYNDGEN generates a syndrome at the data read time. The error correction circuit EC decodes the syndrome and performs an error correction.

Figure 9:
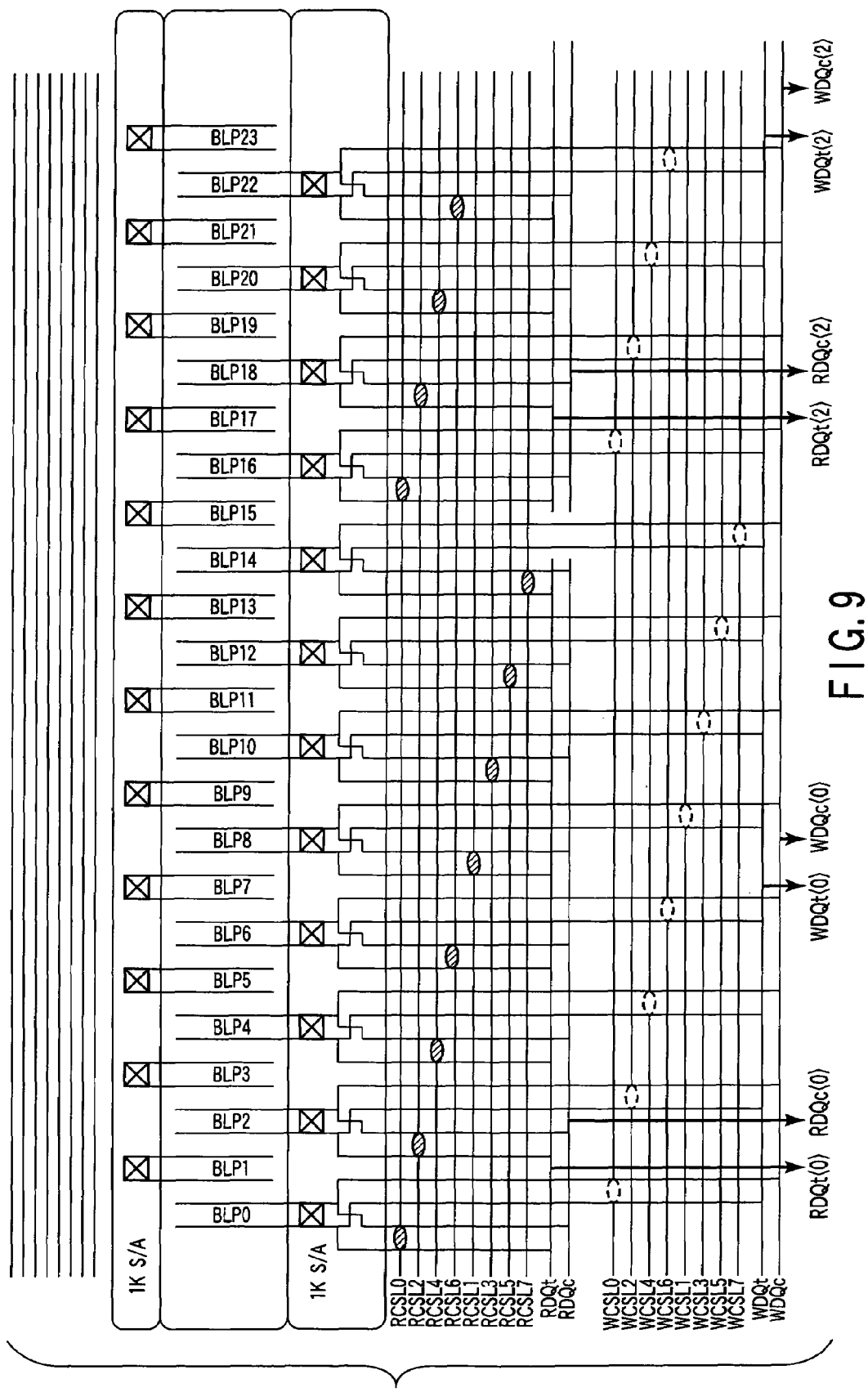
FIG. 9 is a view showing the configuration of a dual port sense amplifier in the semiconductor memory device according to the first embodiment.

Differences between the first embodiment and conventional example shown in FIG. 1 will be described below. In the first embodiment, the DQ line is separated into those for read use and write use. That is, the first embodiment includes two systems: a read RDQ line (RDQt/RDQc) and a write WDQ line (WDQt/WDQc). Therefore, the number of the DQ lines is substantially double that of the conventional example. Accordingly, the sense amplifier is configured as a dual port sense amplifier SADP having a dual port, as shown in FIG. 9.

Further, as shown in the figure, the column selection lines are also separated into two systems: those for read use and write use. That is, read column selection lines RCSL and write column selection lines WCSL are arranged. With the above configuration, a readout operation and write operation with respect to different addresses can be performed in parallel in the same cycle of a clock signal.

In addition, a case where readout and write operations performed with respect to the same address in the same cycle must be taken into consideration. The write operation shown in, e.g., FIG. 10B is used to explain this. In this explanation, the "write operation" indicates the abovementioned "Read-Modify-Write in ECC". In Cycle 0 where write command W is input, read operation (R0) is performed for address CA0. In Cycle 2, write operation (W0) for memory cells is performed. In Cycle 2, where write command W is input, when the address corresponding to write command W is also CA0, readout operation (R2) in Cycle 2 is also performed for address CA0. Accordingly, column selection lines, e.g., RCSL0 and WCSL0 are simultaneously activated to bring about data collision in the dual port sense amplifier SADP. The same problem occurs when a read command for address CA0 has been input in Cycle 2.

To avoid this, the register REG is provided on the rear stage of the error correction circuit EC in FIG. 8. With this configuration, when the column address of the command that has been input in a first cycle is the same as the address for which write operation is performed in the first cycle according to the write command that has previously been input, a readout operation from the memory cell is not performed but data stored in the register REG is used. As a result, it is possible to prevent the collision between readout and write operations.

FIG. 9 is a view showing the configuration of the dual port sense amplifier SADP in the DRAM macro. For simplicity of explanation, only one side of the cell array is shown.

At the write operation time for memory cells, one of the write column selection lines WCSL is selected to connect the WDQ line to the bit line pairs, and thereby data is written in memory cells. At the readout operation from memory cells, one of the read column selection lines RCSL is selected, the data stored in memory cells is amplified by the sense amplifier, and the amplified data is read out to the RDQ line through the bit line pairs.

In the case where readout and write operations are performed with respect to different column addresses, for example, when a readout operation corresponding to the read column selection line RCSL0 and a write operation corresponding to the write column selection line WCSL1 are performed simultaneously, the data on the bit line pairs BLP0 is read out to the RDQt<0>/RDQc<0> line and, at the same time, the data on the WDQt<1>/WDQc<1> line is transmitted to the bit line pairs BLP8 and written in memory cells.

Figure 10A:
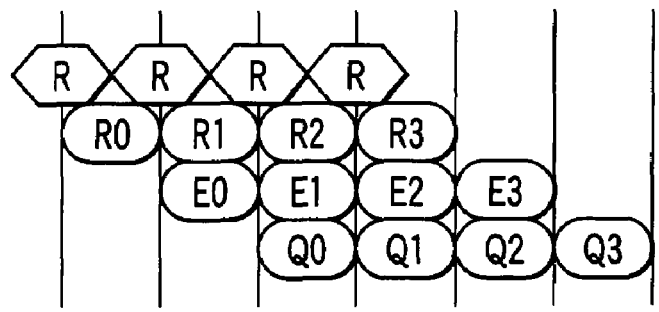
FIGS. 10A, 10B, and 10C are views showing read and write operations in the semiconductor memory device according to the first embodiment.
Figure 10B:
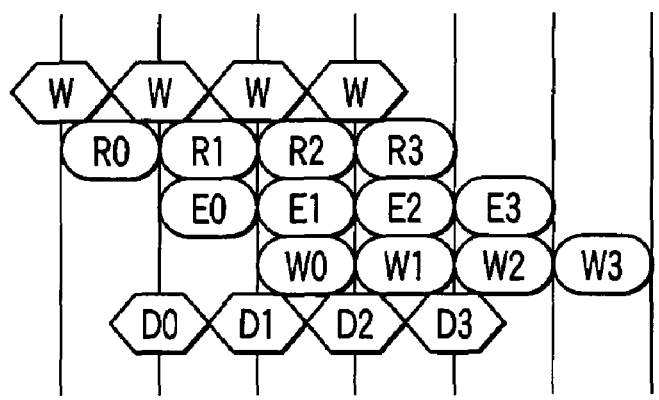
Figure 10C:
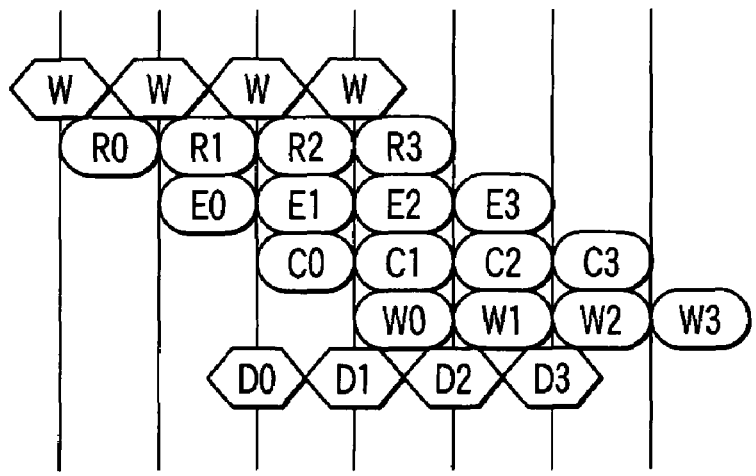

FIGS. 10A, 10B, and 10C are views showing read and write operations in the semiconductor memory device according to the first embodiment.

FIG. 10A shows a read operation performed in the case where a read command R is sequentially input in a 3-stage-pipelined architecture. The operation control performed in FIG. 10A to be described below is the same as that in the conventional example. When column address CA0 is sequentially input in response to read command R, readout operation (R0), that is, an address decode, selection of the column selection lines CSL, and data readout operation to the RD line are performed in Cycle 0. In Cycle 1, a readout operation (R1) for column address CA1 is performed in the same manner as the readout operation (R0) and, at the same time, error correction operation (E0) is applied to the data that has been readout by the readout operation (R0). In Cycle 2, readout operation (R2) for column address CA2, error correction operation (E1) for column address CA1, and output operation (Q0) for column address CAD are performed in parallel.

FIG. 10B shows a write operation performed in the case where a write command W is sequentially input in a 3-stage-pipelined architecture. In FIG. 10B, latency is set to 1 and thereby write data is input one clock late. That is, write data D0, D1 . . . , are input one clock later than the corresponding write command W.

In order to perform "Read-Modify-Write in ECC" operation in FIG. 8, it is necessary to overwrite the data, to which an error correction has been applied, with write data smaller than the input 128 bits to generate a code. Therefore, write data should be input at the time between the completion of the error correction and the start of the code generation. To do this, write data should be input several clocks later than the input cycle of the write command depending on the configuration of the pipeline. As a matter of course, a manner in which write data is input simultaneously with the write command and the input write data is stored in the register until it is required is possible. In this case, however, the chip size is increased by an area for the register to occupy. In the case where the specification that a user may need sets write latency to 0, write data needs to be stored in the register in some cases, as the latter case, depending on the configuration of the pipeline.

FIG. 10C shows a write operation performed in the case where a write command W is sequentially input in a 4-stage-pipelined architecture to be described later. In FIG. 10C, (Ej) denotes a syndrome generation/decode process/error correction; and (Cj) denotes a code generation. In this case, write latency is set to 2. This is because, as in the case of FIG. 10B, write data should be input at the time between the completion of the error correction and the start of the code generation. Note that j is a natural number greater than or equal to 0.

Figure 11A:
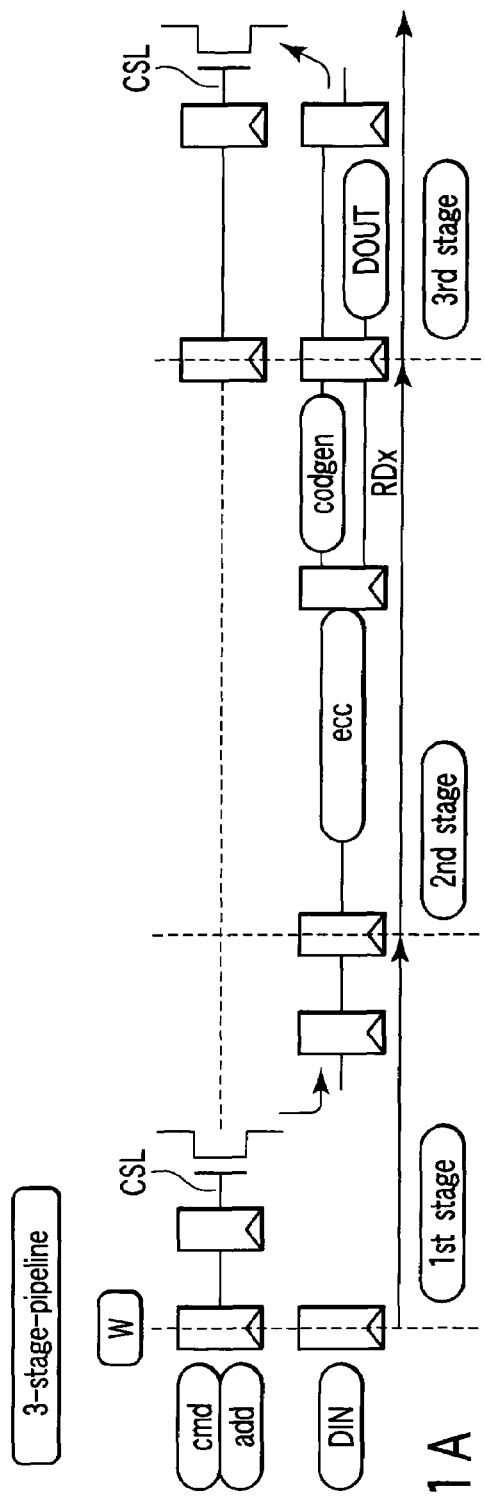
FIGS. 11A and 11B are views each showing a configuration example of a pipeline in the semiconductor memory device according to the first embodiment.
Figure 11B:
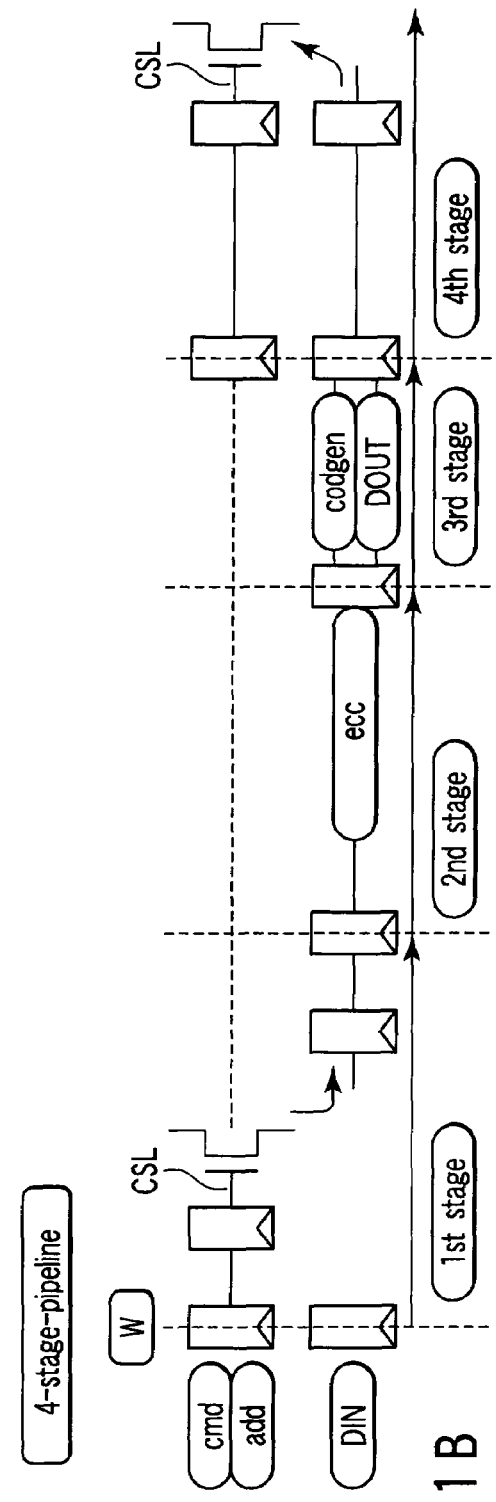

FIGS. 11A and 11B are views each showing the configuration of the pipeline. FIG. 11A shows an example of the 3-stage-pipelined architecture; and FIG. 11B shows an example of the 4-stage-pipelined architecture.

An operation of the 3-stage-pipeline shown in FIG. 11A will be described. When a write command W has been input, the input command and address are decoded, the column selection line CSL is activated, and data is read out from memory cells to the DQ line in first stage. In second stage, an error correction is applied to the read out read data, and the corrected read data and input write data are coded. In third stage, the column selection line CSL corresponding to the same address as that in the first stage is activated and the coded data is written in memory cells. When a read command is input, the coding process and write operation with respect to memory cells are not performed but the error-corrected data is output to the outside in third stage.

In the 4-stage-pipeline shown in FIG. 11B, an error correction for the read out read data and coding process for the corrected read data are performed in different stages. In second stage, an error correction is applied to the read out read data. In third stage, the corrected read data is coded. In fourth stage, the column selection line CSL corresponding to the same address as that in the first stage is activated and the coded data is written into memory cells. When a read command has been input, the coding process and write operation to memory cells are not performed but the error-corrected data is output to the outside in the fourth stage.

As described above, in the semiconductor memory device according to the first embodiment, even in the case where the external data bus width is substantially smaller than the information length of the error correction code to be used, for example, even when the input write data is made smaller than usual due to a byte mask function, data collision in the above mentioned Read-Modify-Write can be prevented, thereby obtaining a high-speed data transfer rate. In addition, it is possible to reduce the chip area on which the semiconductor memory device according to the embodiment is mounted. That is, in the semiconductor memory device having an error correction function, speed penalty can be reduced by duplicating the internal bus even when the bit width of the input data is smaller than the information length of the error correction code. Further, it is also possible to reduce area penalty by introducing a burst mode.

Second Embodiment

A semiconductor memory device including a clock synchronous type DRAM macro according to a second embodiment will next be described. This DRAM macro may individually be formed on a semiconductor substrate, or may be mounted on a semiconductor substrate together with a logic circuit. In this embodiment, the same reference numerals as the first embodiment are given to the components which are common to the first embodiment, and the overlapped description is omitted. Accordingly, only the different points from the first embodiment are explained.

Figure 12:
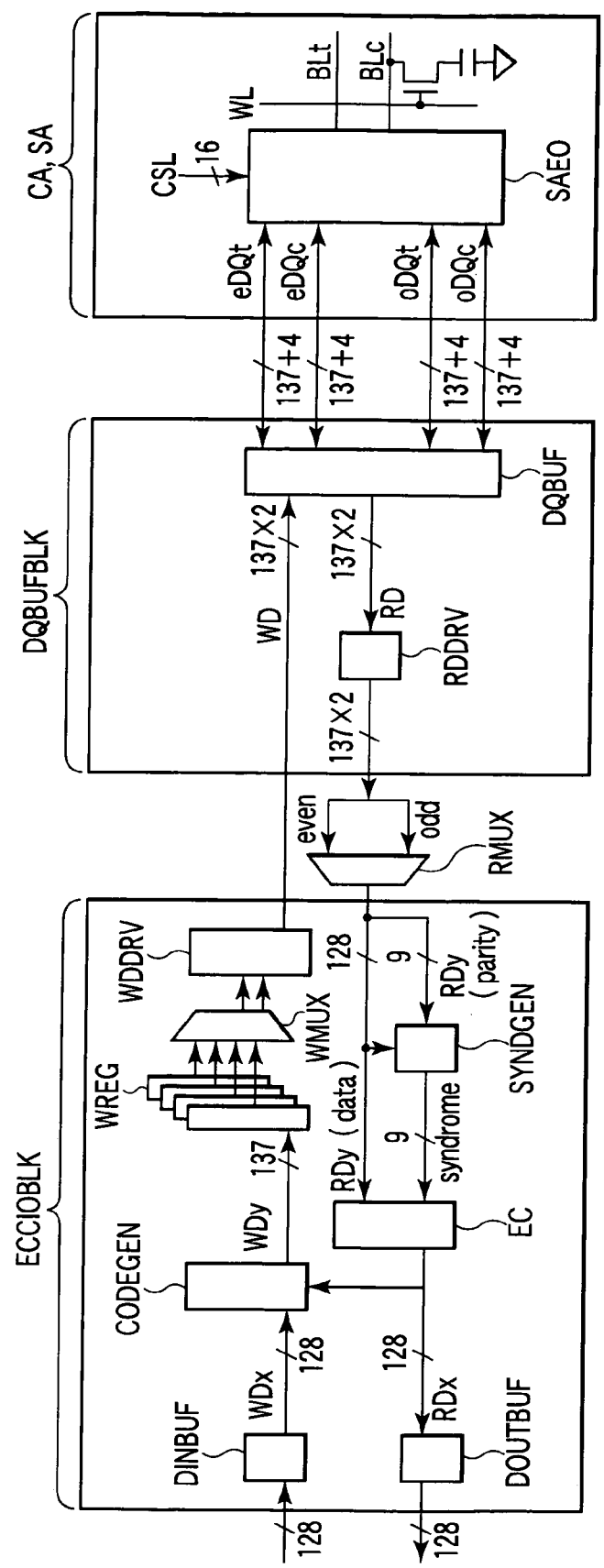
FIG. 12 is a view showing the configuration along data buses in the semiconductor memory device according to second and third embodiments.

FIG. 12 is a view showing the configuration along data buses in the semiconductor memory device according to the second embodiment. The DQ line which connects a sense amplifier SAE0 and DQ buffer DQBUF is separated into an oDQt/oDQc line corresponding to odd address and an eDQt/eDQc line corresponding to even address. A multiplexer RMUX is connected between the RD line drive circuit RDDRV and error correction circuit EC and syndrome generator SYNDGEN. Registers WREG and multiplexer WMUX are connected between the code generation circuit CODEGEN and WD line drive circuit WDDRV. The numbers of the WD and RD lines are double those of the first embodiment.

In the second embodiment, although duplication of the data bus is made, the sense amplifier does not have a dual port. A so-called "2-bit prefetch architecture" which handles even address data and odd address data simultaneously is adopted. Although a read and write command for different address can be input in each cycle in the first embodiment, data input/output at the read and write operation time is performed in a burst operation in the second embodiment. The DQ line is separated into an oDQt/oDQc line corresponding to odd address and an eDQt/eDQc line corresponding to even address, as described above, so that the sense amplifier SAE0 that meets this configuration is adopted.

On the other hand, the data bus is not duplicated in the data input/output control circuits in the ECC input/output block ECCIOBLK, such as the error correction circuit EC, input buffer DINBUF, and output buffer DOUTBUF. The RD line is multiplexed by the multiplexer RMUX at the front stage where it is connected to the ECC input/output block ECCIOBLK and simplexed from 137×2 bits to 137 bits.

As to the write data bus, a 137-bit registers WREG are arranged at the very rear of the code generation circuit CODEGEN. The write data output from the registers WREG is multiplexed by the multiplexer WMUX and output to the WD line and duplicated from 137 bits to 137×2 bits.

In general, a burst mode, where burst lengths such as 2 bits, 4 bits, and 8 bits have been set, is implemented in a commodity-type synchronous DRAM. The burst mode is a function that designates the start address of data and sequentially transfers the data whose number of bits has been defined by the start address.

FIG. 13 shows in detail the ECC input/output block ECCIOBLK of FIG. 12. A read operation in the second embodiment will be described with reference to FIGS. 12 and 13. In this example, the burst length is set to 2. Incidentally, as described later, the same operation is obtained even when the burst length is 4 or 8.

At the read operation time, 137 bits of the data corresponding to address 0 and 137 bits of the data corresponding to address 1 are read out to the RD line simultaneously in Cycle 0. In Cycle 1, the multiplexer RMUX transfers only the 137 bits of the data corresponding to address 0 to the ECC input/output block ECCIOBLK, the syndrome generator SYNDGEN generates a syndrome, and the error correction circuit EC performs an error correction. In Cycle 2, 128 bits of the error-corrected data of address 0 are output to the outside through the output buffer DOUTBUF; on the other hand, the 137 bits of the data of address 1 is transferred to the ECC input/output block ECCIOBLK and subjected to an error correction in the same manner. At the same time, a second burst read command is input and data corresponding to address 2 and that to address 3 are read out to the RD line simultaneously. The following operation is the same as above.

At the write operation time, the data readout operation from memory cells is performed in substantially the same manner as in the case of the read operation described above, except that data is not output to the outside. The read data that has been error-corrected in the error correction circuit EC is synthesized with the write data input from the outside and coded in the code generation circuit CODEGEN. After that, the coded data is sequentially stored in one of the resisters WREG. Further, in the next cycle, two of the resisters WREG are selected and data corresponding to two addresses are simultaneously written in memory cells through the duplicated WD line and DQ line.

Figure 14:
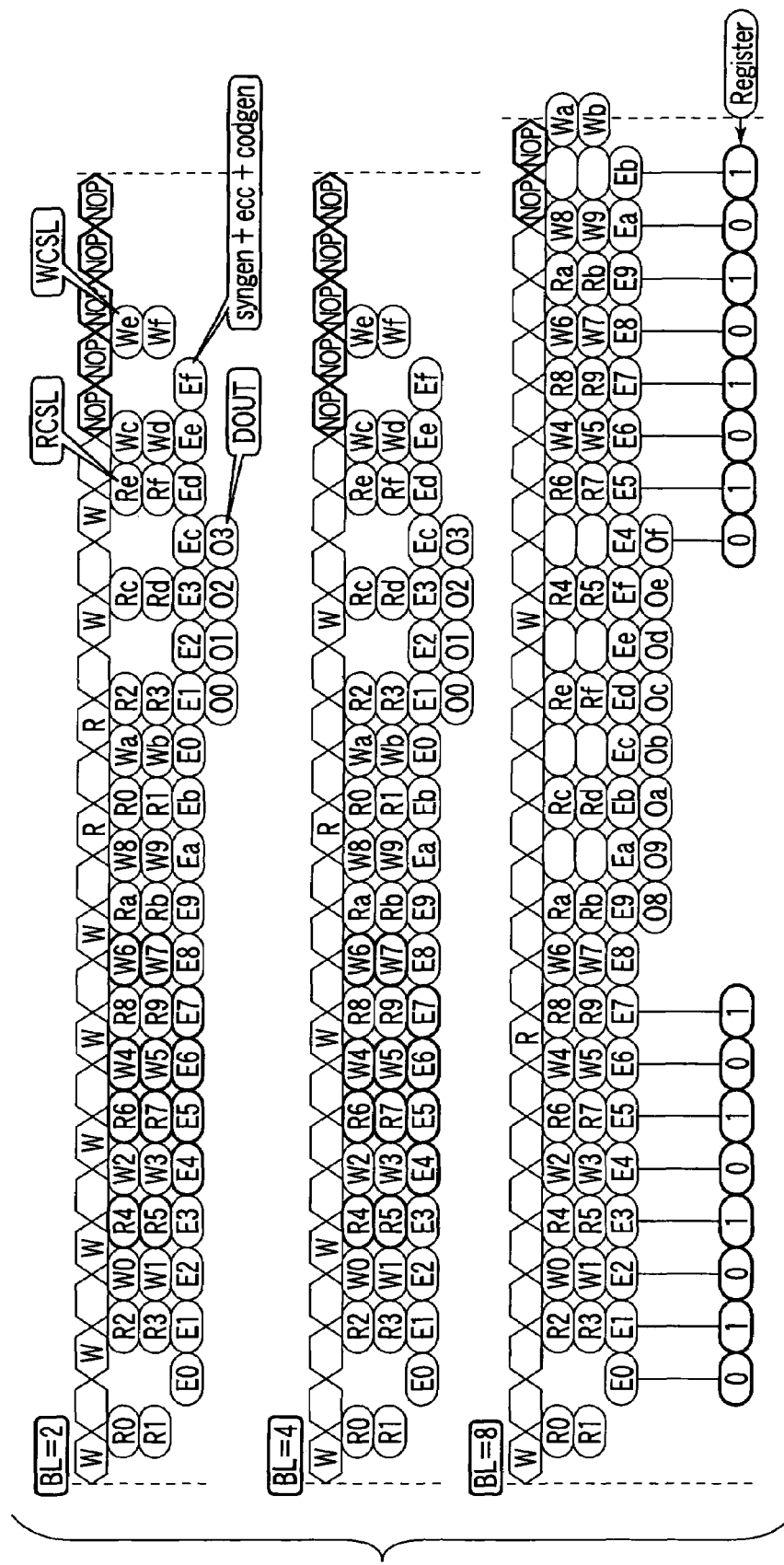
FIG. 14 is a view showing an operation in the semiconductor memory device according to the second embodiment that uses a 3-stage-pipelined architecture.

FIG. 14 is a view showing an operation in the semiconductor memory device according to the second embodiment that uses a 3-stage-pipelined architecture. In FIG. 14, the cases where the burst lengths BL are set to 2, 4, and 8 are shown respectively.

In the case of burst length BL=2, write command W and burst start address are input and, correspondingly, data of address 0 and address 1 are read out to the RD line from memory cells in Cycle 0. This operation is denoted by (R0) and (R1) in FIG. 14. In Cycle 1, the data of address 0 is subjected to an error correction by the syndrome generator SYNDGEN and error correction circuit EC and the error-corrected data is overwritten with input data from the outside. The data that has been overwritten with the input data is coded by the code generation circuit CODEGEN and stored in the resister WREG0. This operation is denoted by (E0).

In Cycle 2, write command W for another start address is input and data corresponding to addresses 2 and 3 are read out from memory cells ((R2) and (R3)). At the same time, the data of address 1 is subjected to an error correction and coding process, and then stored in the register WREG1 (E1).

In Cycle 3, the coded data stored in the resisters WREG 0 and 1 are simultaneously written in memory cells and, at the same time, the data of address 2 is subjected to an error correction and coding process, and stored in the register WREG0. After this, the operation described above is repeated. That is, in terms of the sense amplifier SAE0, a read operation is simultaneously performed for odd and even addresses in even cycles; on the other hand, a write operation is simultaneously performed for odd and even addresses in odd cycles.

Figure 15:
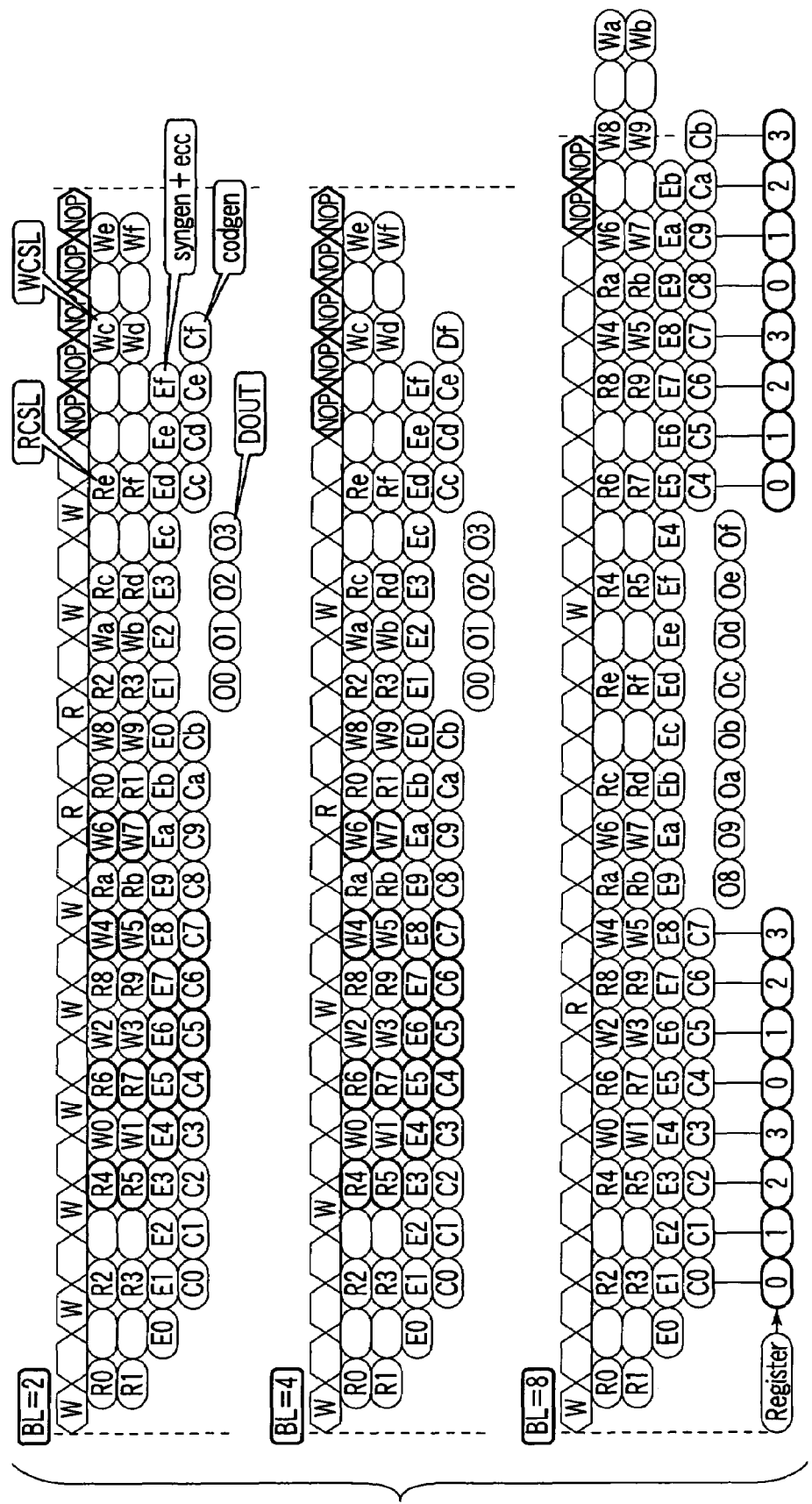
FIG. 15 is a view showing an operation in the semiconductor memory device according to the second embodiment that uses a 4-stage-pipelined architecture.

FIG. 15 is a view showing an operation in the semiconductor memory device according to the second embodiment that uses a 4-stage-pipelined architecture. The pipeline assigns a data error correction to a second stage and a data coding process to a third stage. Since a write operation is performed in odd cycles, data is written in memory cells two cycles later actually, as compared to the case of FIG. 14. Therefore, the number of registers WREG needs to be increased by two as compared to the case of the 3-stage-piplined architecture. Other operations are the same as those shown in FIG. 14. Counting from the burst start, a read operation is simultaneously performed for odd and even addresses in even cycles; on the other hand, a write operation is simultaneously performed for odd and even addresses in odd cycles.

FIG. 16 shows addressing modes of a synchronous DRAM. In either case, data is a combination of even and odd addresses when the 2-bit prefetch architecture is used, so that data collision does not occur at all in the 2-bit prefetch architecture. That is, there is no possibility that two even addresses are simultaneously accessed in the same cycle, for example, column selection lines CSL0 and CSL2 are simultaneously selected in the sense amplifier SAE0 shown in FIG. 17, and data from different memory cells collide against each other on the eDQt<0> and eDQc<0> lines.

FIG. 17 is a view showing the configuration of the sense amplifier SAE0 in the semiconductor memory device according to the second embodiment. The column selection lines CSL0, CSL2, . . . designated by even addresses connect the bit lines to the DQ line (eDQt/eDQc lines) corresponding to even address; on the other hand, the column selection lines CSL1, CSL3, . . . designated by odd addresses connect the bit lines to the DQ line (oDQt/oDQc lines) corresponding to odd address. As described above, the number of DQ lines in the sense amplifier SAE0 is substantially double that in the first embodiment. Further, in the sense amplifier SAE0, the column selection lines CSL need not be separated into those for read use and write use, so that an increase in the chip area can be prevented as compared to the first embodiment.

Although the data bus is duplicated depending on whether even address or odd address has been designated, that is, whether the value of CA0, which is the least significant bit (LSB) of the column address, is 0 or 1 in the second embodiment, the present invention is also applicable to a 4-bit prefetch burst architecture that quadruples the data bus depending on whether the value of the last two bits of the column addresses CA1, CA0 is 00, 01, 10, or 11. Further, in general, the present invention is also applicable to N-bit prefetch burst architecture (N=2, 4, 8, 16, . . . ).

As described above, in the semiconductor memory device according to the second embodiment, even in the case where the external data bus width is substantially smaller than the information length of the error correction code to be used, for example, even when the input write data is made smaller than usual due to a byte mask function, data collision in the above-mentioned Read-Modify-Write can be prevented, thereby obtaining a high-speed data transfer rate. In addition, it is possible to reduce the chip area on which the semiconductor memory device according to the embodiment is mounted.

Third Embodiment

A semiconductor memory device including a clock synchronous type DRAM macro according to a third embodiment will next be described. The configuration along the data buses in the third embodiment is the same as that according to the second embodiment (FIG. 12). A difference between the third and second embodiments is an operation control performed. This DRAM macro may individually be formed on a semiconductor substrate, or may be mounted on a semiconductor substrate together with a logic circuit.

Figure 18:
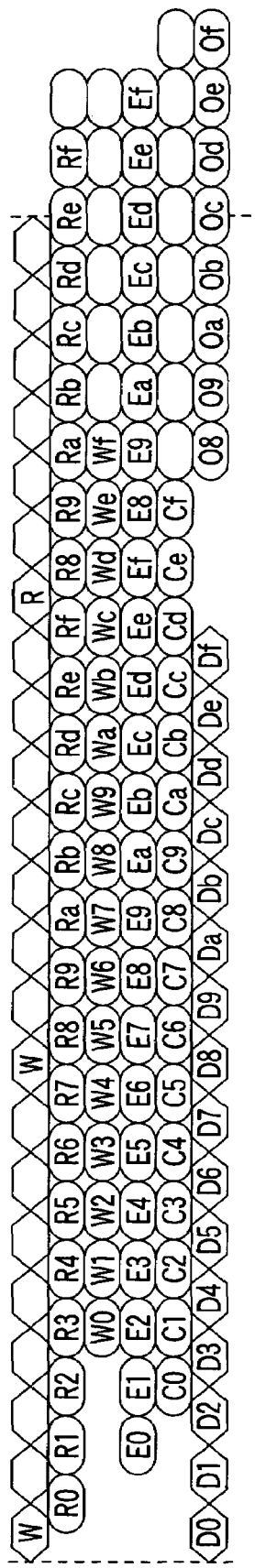
FIG. 18 is a view showing a write operation in the semiconductor memory device according to the third embodiment.

FIG. 18 is a view showing a write operation in the semiconductor memory device according to the third embodiment. In this example, the burst length has been set to 8. When a write command W and start address are designated, data are sequentially read out from memory cells corresponding to the sequential addresses in each cycle. The data is subjected to an error correction by the syndrome generator SYNDGEN and error correction circuit EC in the next cycle subsequent to the cycle in which the data has been read out. In the subsequent cycle, the data is coded by the code generation circuit CODE-GEN. Further, in the subsequent cycle, the data is written in the memory cells corresponding to the address in the initial cycle.

In the operation of the sense amplifier according to the third embodiment, a read operation from memory cells corresponding to odd address and a write operation in memory cells corresponding to even address are simultaneously performed in odd cycles; on the other hand, a read operation from memory cells corresponding to even address and a write operation in memory cells corresponding to odd address are simultaneously performed in even cycles. Therefore, data collision does not occur in the same cycle.

In the sense amplifier, the column selection lines CSL need not be separated into those for read use and write use, so that the chip area on which the semiconductor memory device is mounted can be reduced as compared to the first embodiment. Incidentally, in the third embodiment, the data bus may be multiplexed as in the case of the second embodiment.

As described above, in the semiconductor memory device according to the third embodiment, a read operation from memory cells corresponding to one of the odd and even addresses and a write operation in memory cells corresponding to one of the odd and even addresses are simultaneously performed in one cycle. Therefore, even in the case where the external data bus width is substantially smaller than the information length of the error correction code to be used, for example, even when the input write data is made smaller than usual due to a byte mask function, data collision in a write operation, that is, the abovementioned Read-Modify-Write can be prevented, thereby obtaining a high-speed data transfer rate. In addition, read and write column selection lines CSL need not be independently arranged, so that it is possible to prevent an increase in the chip area on which the semiconductor memory device is mounted.

As described in the above embodiments, even in the synchronous type semiconductor memory device having an error correction function, it is possible to eliminate degradation in cycle time caused by Read-Modify-Write operation, which has been a problem caused when the bit width of the data to be input from the outside is smaller than the information length of the internal error correction code, thereby realizing a high-speed data transfer rate and providing a highly reliable semiconductor memory device with an ECC function.

The semiconductor memory device realized by the embodiments of the present invention has an error correction function highly resistant to α-ray radiated by substances on earth, soft error caused by cosmic ray from outside of the earth, an error caused by unexpected noise at the chip operation time, or an error caused when an electrical charge accumulated in DRAM memory cells is reduced due to leakage. Further, in the case where input/output (I/O) bus widths are narrow or where a byte mask function is used, the error correction code length can be increased, so that it is possible to reduce the chip area that parity bit occupies as well as to realize a high-speed data transfer rate.

According to the embodiments of the present invention, even when the length of the write data that has been input from the outside is smaller than the information length of the error correction code in the semiconductor memory device having an error correction function, it is possible to provide a semiconductor memory device capable of obtaining a high-speed data transfer rate and preventing an increase in the chip area.

Not only that the above embodiments can be carried out singularly, but also that they may be combined appropriately. Further, the above embodiments include various-step inventions, and the plurality of constituent requirements disclosed in the embodiments are properly combined, and thereby, various inventions can be extracted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device which operates in synchronization with a clock signal comprising:
    a memory cell array in which a plurality of memory cells are arranged;
    a plurality of bit lines connected to the plurality of memory cells;
    an input circuit to which data is input;
    a code generation circuit which codes data and generates an error correction code;
    a read data bus to which the data that has been read out from the memory cells is supplied;
    a write data bus to which the data that has been coded by the code generation circuit is supplied;
    a plurality of read column selection lines which are designated by a column address and connects the read data bus to the bit lines;
    a plurality of write column selection lines which are designated by a column address and connects the write data bus to the bit lines;
    a syndrome generation circuit which generates a syndrome from the data that has been read out from the memory cells to the read data bus; and
    a correction circuit which decodes the syndrome that has been generated by the syndrome generation circuit and performs an error correction, wherein
    a read and write operations are performed in the same cycle of the clock signal, the read operation allowing the read column selection lines that have been designated by a first column address to connect the read data bus to the bit lines, and the write operation allowing the write column selection lines that have been designated by a second column address to connect the write data bus to the bit lines, and
    in the write operation, the data obtained by combining the data that has been error-corrected by the syndrome generation circuit and correction circuit with the data that has been input to the input circuit is coded by the code generation circuit and written in the memory cells.

2. The semiconductor memory device according to claim 1, wherein
    the read data bus includes a first and second data buses each with bits width greater than or equal to that of the data coded by the code generation circuit, and the write data bus includes a third and fourth data buses each with bits width greater than or equal to that of the data coded by the code generation circuit.

3. The semiconductor memory device according to claim 1, further comprising a storage circuit which is arranged at a stage subsequent to the correction circuit and stores the data that has been output from the correction circuit, wherein in the case where a read command for performing a read operation has been input after the input of a write command for performing a write operation, if the input column address corresponding to the write command is identical to that corresponding to the read command, the data stored in the storage circuit is output outside thereof as read data.

4. The semiconductor memory device according to claim 1, wherein the bits width of the data to be input to the input circuit at the write operation time is smaller than the information length of the error correction code generated by the code generation circuit.

5. A semiconductor memory device which has a burst mode and operates in synchronization with a clock signal comprising:

a memory cell array in which a plurality of memory cells are arranged;

a plurality of bit lines connected to the plurality of memory cells;

an input circuit to which data is input;

a code generation circuit which codes data and generates an error correction code;

a plurality of storage circuits which is arranged at a stage subsequent to the code generation circuit and stores the error correction code that has been output from the code generation circuit;

a first data bus which is connected to the bit lines by column selection lines when even column address has been designated and has bits width greater than or equal to that of the data that has been coded by the code generation circuit;

a second data bus which is connected to the bit lines by column selection lines when odd column address has been designated and has bits width greater than or equal to that of the data that has been coded by the code generation circuit;

a syndrome generation circuit which generates a syndrome from the data that has been read out to the first and second data buses from memory cells; and a correction circuit which decodes the syndrome that has been generated by the syndrome generation circuit and performs an error correction, wherein at the read operation time in the burst mode, the data corresponding to odd and even addresses which are generated by the burst are read out from memory cells in the same cycle of the clock signal, subjected to an error correction by the syndrome generation circuit and correction circuit, and output to the outside, at the write operation time in the burst mode, the data corresponding to odd and even addresses which are generated by the burst are read out from memory cells in the same cycle of the clock signal and subjected to an error correction by the syndrome generation circuit and correction circuit, and the data obtained by combining the data that has been error-corrected with the data that has been input to the input circuit is coded and sequentially written in the storage circuits, and the data is fetched from the storage circuits that store the data corresponding to the even and odd addresses and written in memory cells in the same cycle of the clock signal through the first and second data buses.

6. The semiconductor memory device according to claim 5, wherein the read operation that reads data corresponding to two addresses to the first and second data buses from the memory cells is performed in even-numbered cycles counting from the clock signal cycle at which the read command for performing the read operation has been input, and the write operation that writes data corresponding to two addresses from the first and second data buses in the memory cells is performed in odd-numbered cycles counting from the clock signal cycle at which the write command for performing the write operation has been input.

7. The semiconductor memory device according to claim 5, wherein the bits width of the data to be input to the input circuit at the write operation time is smaller than the information length of the error correction code generated by the code generation circuit.

8. A semiconductor memory device which has a burst mode and performs a pipeline operation in synchronization with a clock signal comprising:

a memory cell array in which a plurality of memory cells are arranged;

a plurality of bit lines connected to the plurality of memory cells;

an input circuit to which data is input;

a code generation circuit which codes data and generates an error correction code;

a plurality of storage circuits which is arranged at a stage subsequent to the code generation circuit and stores the error correction code that has been output from the code generation circuit;

a first data bus which is connected to the bit lines by column selection lines when even column address has been designated and has bits width greater than or equal to that of the data that has been coded by the code generation circuit;

a second data bus which is connected to the bit lines by column selection lines when odd column address has been designated and has bits width greater than or equal to that of the data that has been coded by the code generation circuit;

a syndrome generation circuit which generates a syndrome from the data that has been read out to the first and second data buses from memory cells; and a correction circuit which decodes the syndrome that has been generated by the syndrome generation circuit and performs an error correction, wherein the pipeline operation is performed such that, at the read operation time in the burst mode, data in the memory cells is read out to the first or second data bus depending on whether the current cycle is even-numbered cycle or odd-numbered cycle counting from the clock signal cycle at which the read command for performing the read operation has been input, and the read out data is then error-corrected by the syndrome generation circuit and correction circuit so as to be output to the outside, and at the write operation time in the burst mode, data in the memory cells is read out to the first or second data bus depending on whether the current cycle is even-numbered cycle or odd-numbered cycle counting from the clock signal cycle at which the write command for performing the write operation has been input, the read out data is then error-corrected by the syndrome generation circuit and correction circuit, and the data obtained by combining the error-corrected data with the data that has been input to the input circuit is coded and sequentially written in the storage circuits so as to be written in the memory cells, in the above pipeline operation, a writing operation to the memory cells with respect to odd address is performed when a reading operation from the memory cells with respect to even address is performed, and a writing operation to the memory cells with respect to even address is performed when a reading operation from the memory cells with respect to odd address is performed in the same cycle of the clock signal.

9. The semiconductor memory device according to claim 8, further comprising: a multiplexer which selects a predetermined number of the storage circuits and outputs the data stored in the selected storage circuits to the first and second data buses.

10. The semiconductor memory device according to claim 8, wherein the bits width of the data to be input to the input circuit at the write operation time is smaller than the information length of the error correction code generated by the code generation circuit.

* * * * *